DEFLECTION SYSTEMS

Filed April 1, 1955

INVENTOR
Morris B. Finkelstein
BY
ATTORNEY

United States Patent Office
2,886,740
Patented May 12, 1959

2,886,740

DEFLECTION SYSTEMS

Morris B. Finkelstein, Collingswood, N.J., assignor to Radio Corporation of America, a corporation of Delaware Application April 1, 1955, Serial No. 498,532

5 Claims. (Cl. 315—27)

The present invention relates to improvements in electromagnetic cathode ray beam deflection systems and more particularly to electromagnetic cathode ray beam deflection systems of the type employing semiconductor amplifier driving means.

The majority of present day semiconductor amplifier devices lend themselves more effectively to current amplification and delivery of signal power to load means having impedance characteristics which are predominantly resistive or in which no significant inductive component is displayed. Semiconductor amplifiers such as transistors are unlike vacuum tube amplifiers in numerous respects. For example, in a vacuum tube amplifier the anode current may be held cut off by the application of a control electrode bias which is a function of the value of peak anode voltage to be applied to the anode. In transistor amplifiers, however, no substantial increase in collector output current will result from an increase in reverse collector bias as long as there is no substantial emitter-base input current to the transistor. However, in transistors the collector electrode, although cut off by emitter bias conditions insofar as transistor action is concerned, will conduct heavily if the potential of the collector is caused to reverse in polarity to produce diode action between the collector and base electrodes. This characteristic of transistors is unlike that of vacuum tubes, since the anode of a vacuum tube will conduct current in one and only one direction. This peculiarity of transistors presents considerable difficulty when attempting to drive inductive loads by means of a transistor and with a waveform having extremely sharp amplitude transitions such as is required in television cathode ray beam deflection systems. The sharp current change through the inductive load tends to reverse the collector bias on the transistor and produce diode action which damps at sharp current change through the inductor to a degree which is sometimes prohibitive.

According to the present invention, inductive load means such as a cathode ray beam deflection yoke is connected in the collector circuit of a transistor amplifier device so as to conduct at least a portion of the collector current flow. The driving signal, for example, of a sawtooth waveform is applied to the emitter-base circuit of the transistor with such electrical polarity and amplitude as to produce an increasing electrical current in response to that portion of the deflection signal representing the slowest rate of amplitude change. The amplitude of the deflection signal is further adjusted so that the maximum reverse bias potential applied to the collector is below the collector breakdown potential of the transistor.

It is therefore an object of the present invention to provide an improved cathode ray beam deflection system employing transistor amplifier devices.

It is a further object of the present invention to provide an improved form of electromagnetic cathode ray beam deflection system which will take maximum advantage of the characteristics of known types of transistor amplifier devices.

It is a further object of the present invention to provide a transistor deflection circuit for use with electromagnetic deflection yokes which is productive of a greater useful amplitude of deflection signal than that obtained in the prior art.

A more complete understanding of the present invention as well as a fuller appreciation of its objects and features of advantage may be obtained through a reading of the following specification, especially when read in connection with the accompanying drawings, in which.

Figures 1, 2, 3, 4, 5, 6:
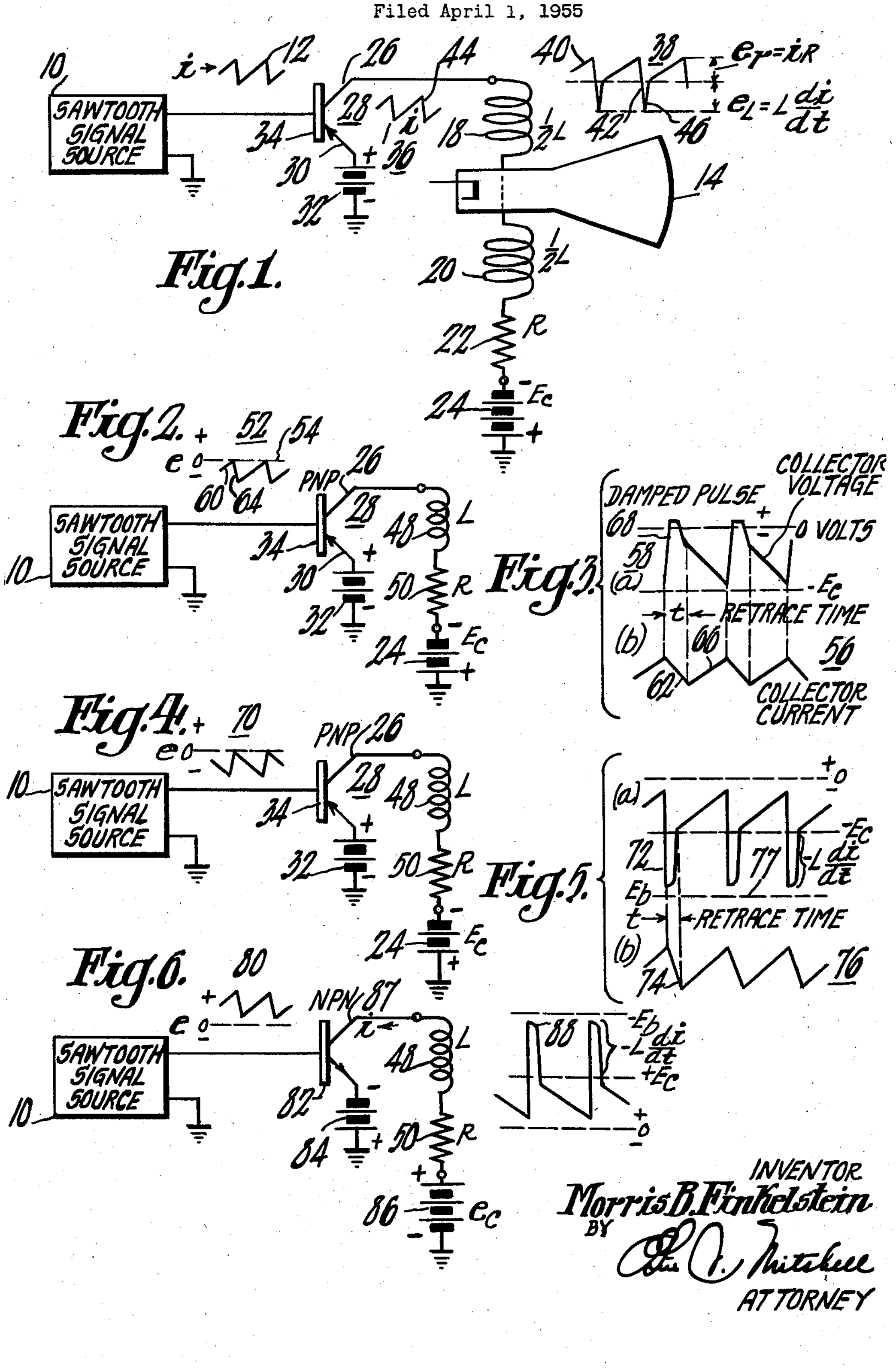
Fig. 1 is a combination block and schematic diagram representing one form of deflection circuit embodying the novel features of the present invention.
Fig. 2 is a combination block and schematic representation of a deflection circuit which illustrates the type of operation obtained when the teachings of the present invention are not followed.
Fig. 3 is a graphical representation of the problems inherent in the circuit arrangement illustrated in Fig. 2.
Fig. 4 is a combination block and schematic representation illustrating certain features of the embodiment of the invention shown in Fig. 1.
Fig. 5 is a graphical representation of certain signal waveforms obtained in the practice of the present invention as shown in Fig. 4, and which illustrates the advantages of the present invention.
Fig. 6 is a combination block and schematic representation of still another form of transistor deflection circuit embodying the novel features of the present invention.

Turning now to Fig. 1, there is shown at 10 a source of deflection signal current which by way of example is indicated at 12 as being of sawtooth waveform. The sawtooth waveform type of deflection signal is well known in the art today and is used extensively in television picture reproducing equipment. For example, in television systems a cathode ray tube device such as kinescope 14 is provided with an electromagnetic deflection yoke having vertical and horizontal deflection windings. The yoke is positioned about the neck of the kinescope 14 such that the field produced by current changes in the deflection windings produces scanning movement of an electron beam within the cathode ray tube. For purposes of illustrating the present invention, only one set of deflection windings will be considered, as it will be readily apparent that the techniques of the present invention may be readily applicable to both horizontal and vertical winding excitation.

In the arrangement of Fig. 1 the deflection winding is represented by two inductors, 18 and 20, connected in series with a resistor 22 of value R. The resistance R merely represents the effective resistance of the entire winding comprising the sections 18 and 20 which make up a total inductance value L. A collector reverse bias potential source 24 is connected in series with the deflection winding between circuit ground and the collector 26 of a semiconductor amplifier 28. The emitter 30 of the semiconductor amplifier is connected with circuit ground through a forward biasing potential source 32 while the base 34 is connected with circuit ground through the sawtooth signal source 10. In this way, current changes in the emitter base circuit of the transistor 28 corresponding to the deflection signal 12 will produce corresponding current changes 36 in the collector circuit current which passes through the deflection yoke winding. A voltage waveform will appear across the deflection yoke winding in response to the current therethrough. This voltage waveform will appear substantially as shown at 38. If the resistive component 22 of the deflection yoke is great enough, the trace portion of the deflection signal shown at 40 will have substantially the same slope as the corresponding trace portion of the current waveform 36. The trace portion 40 corresponds to the relatively slow amplitude change in the direction signal waveform. This is in direct contrast to the retrace portion of the waveform which is represented at 42 on the voltage waveform 38. The retrace portion 42 on the voltage waveform 38 corresponds to the retrace portion 44 of the current waveform 36. Due to the inductive component of the deflection winding, the current change corresponding to the retrace portion, being at a much greater rate, will produce an inductive voltage kick corresponding to the portion 46 of the voltage waveform 38. The peak value of the portion 46 is determined by the total inductance value L of the deflection winding and the rate of current change ($di/dt$) therethrough. During the retrace portion of the deflection cycle as shown in connection with the waveform 38 the upper sawtooth portion 40 is represented by the product of the current through the deflection yoke winding and its resistive component 22. It will be noticed that in the arrangement of Fig. 1 and in accordance with the present invention the voltage kick 46, attributable to the inductance of the deflection yoke winding, is in a direction tending to increase the negative value of potential on the collector 26. Thus, if the amplitude of the driving current waveform 12 is adjusted with respect to the forward biasing influence of the source 32 such that the emitter current is virtually zero during the retrace portion of the deflection cycle, the collector impedance presented by the transistor 28 will be high and present virtually no load on the deflection winding. This will permit the full voltage swing 46 to be executed at or below the self resonant ringing frequency of the deflection yoke winding.

It is conventional in the design of electromagnetic cathode ray beam deflection systems, especially of the television deflection horizontal variety, to ensure that the free resonant ringing frequency of the deflection yoke winding is sufficiently high to produce one half cycle of oscillatory ringing during the desired retrace interval of the deflection cycle.

The arrangement of Fig. 2 illustrates the problems encountered if the principles of the present invention are not practiced. Here a sawtooth signal source 10 is connected with the transistor 28 in the same manner as that shown in Fig. 1. The deflection winding is connected with the collector 26 and circuit ground through the reverse bias potential source 24. In Fig. 2 the deflection winding is represented by the inductor 48 taken in combination with the resistor 50. However, in Fig. 2 the electrical sense of the deflection signal applied to the base 34 of the transistor 28 is opposite to that shown in Fig. 1. The driving deflection signal waveform is represented on a voltage basis at 52 in contrast to the current waveform 12 of Fig. 1. The waveform is shown with respect to a zero voltage axis 54, and represents the driving voltage appearing between base and emitter of the transistor.

Reference to Fig. 3 will illustrate the problems connected with the operation of a circuit of the type shown in Fig. 2. In Fig. 3 the collector current variations in response to the driving deflection signal is shown at 56, Fig. 3*b*, while the collector voltage variation is shown at 58, Fig. 3*a*. It is seen that during the trace portion 60 of the driving waveform 52 (Fig. 2) the yoke current linearly decreases at 62 (Fig. 3*b*) while during the retrace portion 64 of the driving voltage waveform 52 (Fig. 2) the yoke current increases at 66 (Fig. 3*b*). During the increase of yoke current the voltage across the deflection winding swings in a positive direction as shown at 68 on waveform 58 (Fig. 3*a*). At the beginning of the retrace portion 66 the base 34 of the transistor 28 is at or near zero potential tending to cut off collector current.

Simultaneously the collector voltage is at a maximum negative value. In response to the retrace portion 64 of the drive waveform 52, the emitter current tends to rise suddenly causing the current in the yoke winding to increase. The rate of increase is sufficient to develop a self-induced voltage in the inductive component of the yoke winding which tends to drive the collector 26 into a positive polarity relation with respect to the base 34. Since the transistor is indicated as being of the P-N-P variety, this will establish diode type conduction between the collector and base and tend to damp the inductive voltage swing across the yoke winding. This will extend the effective retrace to a value *t* shown in Fig. 3 which may be excessive.

The arrangement in Fig. 4 is identical to that in Fig. 2 with the exception that the electrical sense of the sawtooth drive signal voltage now shown at 70 is reversed. That is to say, the sawtooth driving voltage of Fig. 4 increases in a negative direction during trace and decreases to ground during retrace, whereas in Fig. 2 the driving voltage increases in a negative direction during retrace and decreases to ground during trace. Thus the drive signal 70 of Fig. 4 is 180 degrees out-of-phase with the drive signal of Fig. 2. The action thus obtained in the arrangement of Fig. 4 is therefore identical to that discussed briefly in connection with Fig. 1.

With reference to the voltage and current waveforms respectively shown in Figs. 5*a* and 5*b* it may be seen that the voltage appearing at the collector 26 of the transistor 28 in Fig. 4 swings in a negative direction indicated at 72 as a result of the retrace portion 74 of the current waveform 76 in Fig. 5*b*. In Fig. 5*b* it is seen that the current through the deflection yoke winding decreases during the retrace portion of the deflection cycle and increases during the trace portion. Thus in the arrangement of Fig. 4 as illustrated by the voltage waveform of Fig. 5, the collector potential increases in a reverse bias direction during the retrace time so as to prohibit diode conduction by the collector and base of the transistor 28. The retrace voltage kick 72 in Fig. 5*a* will therefore not be damped as was the corresponding pulse 68 in Fig. 3*a*. The result is a reduction in the retrace time of the deflection current through the deflection yoke. In the arrangement of Fig. 4 it is necessary however that the amplitude of the applied deflection waveform 70 be restricted such that for a nominal value of collector reverse bias provided by the source 24 the peak reversed bias potential applied to the collector 26 will not exceed the collector breakdown potential of the transistor. This breakdown potential is symbolically represented as $E_b$, indicated by dashed line 77 in Fig. 5. The operating conditions of the present invention may therefore be defined as follows:

Where the collector breakdown potential of the driving transistor is of the value of $E_b$ volts, the inductance value of the deflection winding is L henries, and where the value of reverse bias potential supplied by the source 24 is of value $E_c$ volts and where instantaneous value of current through the deflection winding is *i* amperes, the following conditions should be met:

$$L\frac{di}{dt}+E_c<E_b$$

with the additional condition that the collector current flow through the winding decreases in numerical value during and in response to the retrace portion of the deflection cycle. Here $di/dt$ expresses the rate of current change during the retrace portion of the cycle and is of course dependent on the amplitude of the deflection signal applied to the base of the transistor.

It is not altogether necessary in the practice of the present invention to ensure that the emitter-base current be absolutely zero during or at the beginning of the retrace portion of the deflection cycle since the collector output impedance is relatively high for low values of emitter-base input current.

The arrangement of the present invention shown in Fig. 6 illustrates a useful deflection circuit employing an N-P-N type of transistor. The considerations discussed in connection with the arrangement of Figs. 1 and 4 are applied in the circuitry of Fig. 6. Here the sawtooth signal source 10 is productive of a driving signal polarity shown at 80 where the waveform 80 depicts a voltage variation of the transistor base 82 in response to the signal source. The forward bias source 84 for the emitter if used will be of the opposite polarity to the voltage source 32 shown in Fig. 4 in connection with the P-N-P transistor. Likewise, the reverse collector bias potential source 86 connected in series with the deflection yoke winding and collector 87 of the N-P-N transistor in Fig. 6 will be of a polarity opposite to the P-N-P collector bias source 24 in Fig. 4. The voltage waveform 80 in Fig. 6 driving the transistor is in accordance with the present invention of a signal polarity producing a decrease in the numerical value of the collector current flow through the deflection winding in response to the retrace portion of the deflection signal. Thus the voltage peak 88 appearing at the collector 87 in response to the retrace portion of the deflection cycle will be in a positive direction which for an N-P-N type of transistor tends to increase the potential on the polarity 87 in the direction corresponding to an increase in the reverse bias on the transistor. Thus, diode action between the emitter 87 and base 82 of the N-P-N transistor is prohibited and the inductive voltage pulse 88 will not be damped. The retrace time of the deflection cycle will therefore be undisturbed by any of the characteristics of the transistor.

The advantages of the present invention are in no way limited to the particular circuit configurations shown in the drawings. For example, it is immaterial whether the transistor driving the deflection yoke winding be connected in a grounded emitter or a grounded base configuration. Likewise, it is not important whether the entire collector current flow of the transistor be caused to pass through the deflection yoke winding should it be found expedient to bypass a portion thereof for other purposes. Moreover it is clearly within the scope of the present invention to employ transformer coupling means between the deflection yoke proper and the collector load circuit of the driving transistor. In such case the leakage inductance of the coupling transformer will define in part the effective value of inductance appearing in the collector circuit of the transistor. With such an arrangement the transformer becomes, for the purposes of the present invention, a part of the inductive cathode ray beam deflection means being driven by the transistor.

Having thus described my invention, what is claimed is:

1. In a transistor cathode ray beam deflection system the combination of: a signal source of periodically recurrent deflection waveform having a trace portion represented by a relatively slow amplitude change and a retrace portion represented by a relatively fast amplitude change, a semiconductor amplifier device having electrodes corresponding to an emitter, collector and base and having a collector breakdown potential rating value of $E_b$ volts; a series combination of an inductive deflection yoke winding and a collector reverse bias potential source means connected between said collector and said base, the value of reverse bias potential applied to said collector being of a value $E_c$ volts and less than said value $E_b$ volts to permit collector current flow through said winding, and the effective value of inductance displayed by said winding being of value L henries; and means operatively connected with said semiconductor amplifier device for applying said deflection waveform between the base and emitter electrodes of said semiconductor amplifier of such value and polarity that the collector current decreases during and in response to said deflection signal retrace portion at a rate $di/dt$ expressed in amperes per second and so limited that the following relation obtains:

$$L\frac{di}{dt}+E_c<E_b$$

2. In a cathode ray beam deflection circuit the combination of: a source of periodically recurrent deflection signal waveform having a trace portion represented by a relatively slow amplitude change and a retrace portion represented by a relatively fast amplitude change; a semiconductor amplifier device having electrodes corresponding to an emitter, collector and base and having a collector breakdown potential rating of value $E_b$ volts; a cathode ray beam deflection yoke winding of inductance value L henries and a collector reverse bias potential source means connected in series with one another to form a load means which is in turn connected between said collector and said base, the value of reverse bias so applied to said collector being of value $E_c$ volts substantially less than said value of $E_b$ volts to permit collector current flow of instantaneous value $i$ amperes through said yoke winding; means operatively coupling said signal source with the base and emitter electrodes of said semiconductor amplifier device of such value and polarity that the collector current flow through said winding decreases in numeric value during and in response to said deflection signal retrace portion at a rate $di/dt$ expressed in amperes per second, the value $di/dt$ and the value L being related to the collector bias value $E_c$ such that $$L\frac{di}{dt}+E_c<E_b$$

and emitter forward bias means connected in said input circuit means of a value such that said emitter to base potential is reduced to substantially zero by peak excursions of said deflection signal as coupled to said input circuit.

3. In an electrical circuit for delivering a sawtooth current waveform to an inductive load means, the combination of: load means having an inductance value of L henries; a source of driving current waveform for defining said sawtooth current waveform in said load means; a semiconductor amplifier device having at least an emitter, base and collector with a reverse bias collector breakdown rating of $E_b$ volts; output circuit means connected with said collector and including reverse bias means operatively connected with said collector and said base imposing a maximum reverse bias value $E_c$ on said collector; means connecting said load means in said output circuit means such to carry at least a portion of current conducted by said collector, the instantaneous value of said current portion being designated as $i$ amperes such that a current change rate $di/dt$ induces a voltage $E_L$ in said inductive load means in supplementation of said collector reverse bias; and means for applying said driving current waveform between said emitter and said base to produce an emitter input current envelope of such polarity and magnitude that the maximum collector current change in the direction causing the voltage $E_c$ to increase the numerical value of instantaneous potential of said collector in the direction of increased reverse collector bias is such that $$E_L+E_c<E_b$$

4. In a transistor cathode ray beam deflection system the combination of: a source of periodically recurrent deflection signal waveform having a trace portion represented by a relatively slow amplitude change and a retrace portion represented by a relatively fast amplitude change, a semiconductor amplifier device having electrodes corresponding to an emitter, collector and base and having a collector breakdown potential rating value of $E_b$ volts, a series combination of a direct current conductive electromagnetic deflection means having an inductive component L with a collector reverse bias potential source means, said combination being connected between said collector and said base, the value of reverse bias potential so applied to said collector being of value $E_c$ volts and less than said value $E_b$ volts, to permit collector current flow through said deflection means; and means connecting said deflection signal waveform source between the base and emitter electrodes of said semiconductor amplifier device for applying a deflection signal waveform between said base and emitter electrodes of such value and polarity that the collector current decreases during and in response to said deflection signal retrace portion at a rate *di/dt* expressed in amperes per second and so limited that the following relation obtains $$L\frac{di}{dt}+E_c<E_b$$

5. In a transistor cathode ray beam deflection system, the combination comprising, a transistor including base, emitter, and collector electrodes, a deflection winding connected between said collector and emitter electrodes and responsive to output collector current flow of said transistor, means for applying a forward bias voltage between said emitter and base electrodes and a reverse bias voltage between said collector and base electrodes, and a sawtooth signal source connected between said base and emitter electrodes for applying a sawtooth voltage waveform to said base electrode, said sawtooth voltage waveform having a trace portion which increases to a predetermined voltage from a reference voltage point and a retrace portion which decreases from said predetermined voltage to said reference voltage point, said sawtooth voltage waveform being of such polarity and electrical sense to provide increased output collector current flow through said deflection winding in response to the trace portion of said waveform and decreased output collector current flow through said deflection winding in response to the retrace portion of said waveform.

References Cited in the file of this patent

UNITED STATES PATENTS

| | | |
|---|---|---|
| 2,585,078 | Barney | Feb. 12, 1952 |
| 2,747,136 | Herzog | May 22, 1956 |

FOREIGN PATENTS

| | | |
|---|---|---|
| 701,634 | Great Britain | Dec. 30, 1953 |
| 703,685 | Great Britain | Feb. 10, 1954 |
| 1,088,742 | France | Sept. 15, 1954 |